US008854074B2

(12) United States Patent
Berkley

(10) Patent No.: US 8,854,074 B2
(45) Date of Patent: Oct. 7, 2014

(54) SYSTEMS AND METHODS FOR SUPERCONDUCTING FLUX QUBIT READOUT

(75) Inventor: Andrew J. Berkley, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 0 days.

(21) Appl. No.: 13/808,006

(22) PCT Filed: Nov. 10, 2011

(86) PCT No.: PCT/US2011/060216
§ 371 (c)(1),
(2), (4) Date: Jul. 15, 2013

(87) PCT Pub. No.: WO2012/064974
PCT Pub. Date: May 18, 2012

(65) Prior Publication Data
US 2013/0278283 A1 Oct. 24, 2013

Related U.S. Application Data

(60) Provisional application No. 61/412,691, filed on Nov. 11, 2010.

(51) Int. Cl.
| H03K 19/195 | (2006.01) |
| H03K 3/38 | (2006.01) |
| B82Y 10/00 | (2011.01) |
| G06N 99/00 | (2010.01) |

(52) U.S. Cl.
CPC .............. *H03K 19/195* (2013.01); *B82Y 10/00* (2013.01); *G06N 99/002* (2013.01)
USPC ..................... 326/5; 326/3; 327/528; 505/170

(58) Field of Classification Search
USPC ........ 326/3, 5; 257/31, 36; 327/528; 505/170
See application file for complete search history.

(56) References Cited

U.S. PATENT DOCUMENTS 7,135,701 B2   11/2006   Amin et al.
7,418,283 B2    8/2008   Amin
(Continued)

FOREIGN PATENT DOCUMENTS

WO    2009/120638 A2    10/2009
WO    2009/149083 A2    12/2009

OTHER PUBLICATIONS

Clarke et al., "Quiet Readout of Superconducting Flux States," Physica Scripta. T102:173-177, 2002.
(Continued)

*Primary Examiner* — Daniel D Chang
(74) *Attorney, Agent, or Firm* — Seed IP Law Group PLLC

(57) ABSTRACT

Systems and methods for reading out the states of superconducting flux qubits may couple magnetic flux representative of a qubit state to a DC-SQUID in a variable transformer circuit. The DC-SQUID is electrically coupled in parallel with a primary inductor such that a time-varying (e.g., AC) drive current is divided between the DC-SQUID and the primary inductor in a ratio that is dependent on the qubit state. The primary inductor is inductively coupled to a secondary inductor to provide a time-varying (e.g., AC) output signal indicative of the qubit state without causing the DC-SQUID to switch into a voltage state. Coupling between the superconducting flux qubit and the DC-SQUID may be mediated by a routing system including a plurality of latching qubits. Multiple superconducting flux qubits may be coupled to the same routing system so that a single variable transformer circuit may be used to measure the states of multiple qubits.

22 Claims, 7 Drawing Sheets

(56) References Cited

U.S. PATENT DOCUMENTS

| | | |
|---|---|---|
| 7,533,068 B2 | 5/2009 | Maassen van den Brink et al. |
| 7,843,209 B2 | 11/2010 | Berkley |
| 8,008,942 B2 | 8/2011 | van den Brink et al. |
| 8,018,244 B2 | 9/2011 | Berkley |
| 2007/0052441 A1* | 3/2007 | Taguchi et al. .................. 326/3 |
| 2008/0176750 A1 | 7/2008 | Rose et al. |
| 2009/0078931 A1* | 3/2009 | Berkley .......................... 257/31 |
| 2009/0121215 A1 | 5/2009 | Choi |
| 2009/0289638 A1 | 11/2009 | Farinelli et al. |
| 2011/0022820 A1 | 1/2011 | Bunyk et al. |
| 2011/0060780 A1 | 3/2011 | Berkley et al. |
| 2011/0065586 A1 | 3/2011 | Maibaum et al. |
| 2012/0094838 A1* | 4/2012 | Bunyk et al. .................. 505/170 |

OTHER PUBLICATIONS

International Search Report, mailed May 18, 2012, for PCT/US2011/060216, 3 pages.

Written Opinion, mailed May 18, 2012, for PCT/US2011/060216, 3 pages.

* cited by examiner

SYSTEMS AND METHODS FOR SUPERCONDUCTING FLUX QUBIT READOUT

CROSS REFERENCE TO RELATED APPLICATIONS

This application is a U.S. national stage application filed under 35 U.S.C. §371 of International Patent Application PCT/US2011/060216, accorded an international filing date of Nov. 10, 2011, which claims benefit under 35 U.S.C. 119(e) of U.S. Provisional Patent Application Ser. No. 61/412,691, filed Nov. 11, 2010, and entitled "Systems And Methods for Superconducting Flux Qubit Readout," both of which are incorporated herein by reference in their entirety.

BACKGROUND

Field

The present systems and methods generally relate to readout schemes for superconducting quantum processors implementing superconducting flux qubits.

Superconducting Qubits

There are many different hardware and software approaches under consideration for use in quantum computers. One hardware approach employs integrated circuits formed of superconducting material, such as aluminum and/or niobium, to define superconducting qubits. Superconducting qubits can be separated into several categories depending on the physical property used to encode information. For example, they may be separated into charge, flux and phase devices. Charge devices store and manipulate information in the charge states of the device; flux devices store and manipulate information in a variable related to the magnetic flux through some part of the device; and phase devices store and manipulate information in a variable related to the difference in superconducting phase between two regions of the phase device.

Many different forms of superconducting flux qubits have been implemented in the art, but all successful implementations generally include a superconducting loop (i.e., a "qubit loop") that is interrupted by at least one Josephson junction. Some embodiments implement multiple Josephson junctions connected either in series or in parallel (i.e., a compound Josephson junction) and some embodiments implement multiple superconducting loops.

Quantum Processor

A quantum processor may take the form of a superconducting quantum processor. A superconducting quantum processor may include a number of qubits and associated local bias devices, for instance two or more superconducting qubits. A superconducting quantum processor may also employ coupling devices (i.e., "couplers") providing communicative coupling between qubits. Further detail and embodiments of exemplary quantum processors that may be used in conjunction with the present systems and methods are described in U.S. Pat. Nos. 7,533,068, 8,008,942, U.S. Patent Publication 2008-0176750, U.S. Patent Publication 2009-0121215, and PCT Patent Publication 2009-120638 (now U.S. Patent Publication 2011-0022820).

Adiabatic Quantum Computation

Adiabatic quantum computation typically involves evolving a system from a known initial Hamiltonian (the Hamiltonian being an operator whose eigenvalues are the allowed energies of the system) to a final Hamiltonian by gradually changing the Hamiltonian. A simple example of an adiabatic evolution is:

$$H_e = (1-s)H_i + sH_f$$

where $H_i$ is the initial Hamiltonian, $H_f$ is the final Hamiltonian, $H_e$ is the evolution or instantaneous Hamiltonian, and s is an evolution coefficient which controls the rate of evolution. As the system evolves, the s coefficient s goes from 0 to 1 such that at the beginning (i.e., s=0) the evolution Hamiltonian $H_e$ is equal to the initial Hamiltonian $H_i$ and at the end (i.e., s=1) the evolution Hamiltonian $H_e$ is equal to the final Hamiltonian $H_f$. Before the evolution begins, the system is typically initialized in a ground state of the initial Hamiltonian $H_i$ and the goal is to evolve the system in such a way that the system ends up in a ground state of the final Hamiltonian $H_f$ at the end of the evolution. If the evolution is too fast, then the system can be excited to a higher energy state, such as the first excited state. In the present systems and methods, an "adiabatic" evolution is considered to be an evolution that satisfies the adiabatic condition:

$$\dot{s}|\langle 1|dH_e/ds|0\rangle| = \delta g^2(s)$$

where $\dot{s}$ is the time derivative of s, g(s) is the difference in energy between the ground state and first excited state of the system (also referred to herein as the "gap size") as a function of s, and δ is a coefficient much less than 1.

The evolution process in adiabatic quantum computing may sometimes be referred to as annealing. The rate that s changes, sometimes referred to as an evolution or annealing schedule, is normally slow enough that the system is always in the instantaneous ground state of the evolution Hamiltonian during the evolution, and transitions at anti-crossings (i.e., when the gap size is smallest) are avoided. Further details on adiabatic quantum computing systems, methods, and apparatus are described in U.S. Pat. Nos. 7,135,701 and 7,418,283.

Quantum Annealing

Quantum annealing is a computation method that may be used to find a low-energy state, typically preferably the ground state, of a system. Similar in concept to classical annealing, the method relies on the underlying principle that natural systems tend towards lower energy states because lower energy states are more stable. However, while classical annealing uses classical thermal fluctuations to guide a system to its global energy minimum, quantum annealing may use quantum effects, such as quantum tunneling, to reach a global energy minimum more accurately and/or more quickly than classical annealing. It is known that the solution to a hard problem, such as a combinatorial optimization problem, may be encoded in the ground state of a system Hamiltonian and therefore quantum annealing may be used to find the solution to such a hard problem. Adiabatic quantum computation is a special case of quantum annealing for which the system, ideally, begins and remains in its ground state throughout an adiabatic evolution. Thus, those of skill in the art will appreciate that quantum annealing systems and methods may generally be implemented on an adiabatic quantum computer, and vice versa. Throughout this specification and the appended claims, any reference to quantum annealing is intended to encompass adiabatic quantum computation unless the context requires otherwise.

Quantum annealing is an algorithm that uses quantum mechanics as a source of disorder during the annealing process. The optimization problem is encoded in a Hamiltonian $H_P$, and the algorithm introduces strong quantum fluctuations by adding a disordering Hamiltonian $H_D$ that does not commute with $H_P$. An example case is:

$$H_E = H_P + \Gamma H_D,$$

where $\Gamma$ changes from a large value to substantially zero during the evolution and $H_E$ may be thought of as an evolution Hamiltonian similar to $H_e$ described in the context of adiabatic quantum computation above. The disorder is slowly removed by removing $H_D$ (i.e., reducing $\Gamma$). Thus, quantum annealing is similar to adiabatic quantum computation in that the system starts with an initial Hamiltonian and evolves through an evolution Hamiltonian to a final "problem" Hamiltonian $H_P$ whose ground state encodes a solution to the problem. If the evolution is slow enough, the system will typically settle in a local minimum close to the exact solution. The performance of the computation may be assessed via the residual energy (distance from exact solution using the objective function) versus evolution time. The computation time is the time required to generate a residual energy below some acceptable threshold value. In quantum annealing, $H_P$ may encode an optimization problem and therefore $H_P$ may be diagonal in the subspace of the qubits that encode the solution, but the system does not necessarily stay in the ground state at all times. The energy landscape of $H_P$ may be crafted so that its global minimum is the answer to the problem to be solved, and low-lying local minima are good approximations.

The gradual reduction of $\Gamma$ in quantum annealing may follow a defined schedule known as an annealing schedule. Unlike traditional forms of adiabatic quantum computation where the system begins and remains in its ground state throughout the evolution, in quantum annealing the system may not remain in its ground state throughout the entire annealing schedule. As such, quantum annealing may be implemented as a heuristic technique, where low-energy states with energy near that of the ground state may provide approximate solutions to the problem.

Flux Qubit Readout in Adiabatic Quantum Computation and Quantum Annealing

In both adiabatic quantum computation and quantum annealing, a network of qubits is initiated in a first configuration and evolved by a quantum process to a second configuration in accordance with an annealing schedule. The second configuration is defined by the states of the qubits at the end of the quantum evolution. The qubit states are read out using a readout system. An important feature of adiabatic quantum computation and quantum annealing is that the qubit states typically only need to be read out at the end of the annealing schedule when the quantum evolution has finished. This means that the qubit states that are read out are actually classical states.

Systems and methods for flux qubit readout in processors designed to perform adiabatic quantum computation and/or quantum annealing are typically only used to read out the classical 0 and 1 states of the qubits at the end of a quantum evolution. This is in contrast to readout systems and methods in processors designed to perform gate-model and/or circuit-model quantum computation, where it can be necessary for the readout system to probe states of the qubits during the computation process without destroying those states.

The classical 0 and 1 states of a superconducting flux qubit are typically associated with clockwise and counter-clockwise circulating currents (respectively, though the assignment of direction is arbitrary; i.e., the 0 state may be associated with clockwise circulating current while the 1 state is associated with counter-clockwise circulating current, or the 0 state may be associated with counter-clockwise circulating current while the 1 state is associated with clockwise circulating current) in the qubit loop. The circulating current in the qubit loop is typically measured indirectly by inferring its direction from the direction of the resulting magnetic field (or magnetic flux) produced. For example, FIG. 1A is a schematic diagram of a superconducting flux qubit 100a having a qubit loop 101a and a compound Josephson junction 102a. Qubit 100a is illustrated in an exemplary 0 state where the circulating current in qubit loop 101a flows in a clockwise direction as indicated by arrow 110a. A clockwise circulating current 110a in qubit loop 101a produces a magnetic field 120a directed into the page of FIG. 1A. The 0 state of qubit 100a may be read out by positioning a magnetometer, such as a DC-SQUID, sufficiently proximate qubit loop 101a to determine at least the direction of magnetic field 120a.

Conversely, FIG. 1B is a schematic diagram of a superconducting flux qubit 100b having a qubit loop 101b and a compound Josephson junction 102b. Qubit 100b is illustrated in an exemplary 1 state where the circulating current in qubit loop 101b flows in a counter-clockwise direction as indicated by arrow 110b. A counter-clockwise circulating current 110b in qubit loop 101b produces a magnetic field 120b directed out of the page of FIG. 1B. The 1 state of qubit 100b may be read out by positioning a magnetometer, such as a DC-SQUID, sufficiently proximate qubit loop 101b to determine at least the direction of magnetic field 120b. Those of skill in the art will appreciate that the assignment between current (or magnetic field) direction and qubit state is arbitrary.

FIG. 2 is a schematic diagram of a readout system 200 employing a DC-SQUID magnetometer 201 to read out the classical state of a superconducting flux qubit 202. As previously described, the state of qubit 202 is indicated by the direction of circulating current in the qubit loop 211. Qubit 202 is illustrated in a 0 state having a clockwise circulating current as indicated by arrow 250. This clockwise circulating current produces a magnetic field 260 in a direction into the page in FIG. 2. The qubit loop 211 of qubit 202 is positioned sufficiently proximate DC-SQUID magnetometer 201 such that magnetic field 260 is inductively coupled (e.g., illustrated with dotted arrow 270) to DC-SQUID magnetometer 201. In this way, the state of qubit 202 is measured or otherwise determined (i.e., read out) by DC-SQUID magnetometer 201.

Readout system 200 illustrated in FIG. 2 is well-known in the art. Nonetheless, real implementations of readout system 200 can be problematic because a readout event can involve the dissipation of significant energy. DC-SQUID 201 indicates the state of qubit 202 by switching into a voltage state, which necessarily generates heat and consequently increases the temperature of qubit 202.

The performance characteristics of superconducting qubits are known to be heavily influenced by the temperature at which the superconducting qubits are operated. In general, it is advantageous to operate superconducting qubits at as cold a temperature as possible, typically on the order of ~20 mK. Since readout system 200 relies on DC-SQUID 201 switching into its voltage state, the operation of readout system 200 undesirably heats qubit 201 and has an adverse effect on the performance characteristics of qubit 201. Thus, after readout system 200 is operated, it is necessary to wait for qubit 201 to re-cool (i.e., "thermalize") and return to its base temperature before performing further computations or evolutions with qubit 201.

As previously described, in applications of adiabatic quantum computation and quantum annealing, it is typically only desired to determine the classical state of the qubits at the end of a quantum evolution. For a single computation there are no further evolutions of the qubits required after readout, but the heating effects of readout system 200 can still be problematic. This is because it is often advantageous to run multiple readout operations even after a single iteration of computation in order to determine a distribution of readout probabilities. In this case, successive readout operations must be separated by a thermalization period to allow the system to return to colder temperatures. Furthermore, adiabatic quantum computation and quantum annealing are inherently heuristic approaches to performing computation and, therefore, can generally benefit from being run in multiple iterations. For example, in order to employ adiabatic quantum computation or quantum annealing to solve a problem, it may be preferable to run multiple iterations of the adiabatic quantum computation or quantum annealing algorithm and to select the "best" output as the solution to the problem. That is, a computational problem may preferably be solved by initializing the qubits of a quantum processor in a first configuration, evolving the qubits of the quantum processor to a second configuration, reading out the states of the qubits, and then repeating for a second iteration by re-initializing the qubits in a first configuration, re-evolving the qubits to a second configuration, re-reading out the states of the qubits, and then repeating again for additional iterations, etc. until a solution is output that satisfies some solution criteria.

For the iterative approach to adiabatic quantum computation and quantum annealing described above, the heating effect of DC-SQUID 201 in readout system 200 can introduce significant "thermalization delays" as it is necessary to wait for the qubits to re-cool after the readout of a first iteration before proceeding with a second iteration. Depending on the cooling power of the refrigeration system being used and on the quality of thermal connections to the qubits, the resulting thermalization delays can considerably increase the time it takes to produce a satisfactory solution to the computational problem. Accordingly, there remains a need in the art for a readout system that reduces or eliminates these thermalization delays to thereby enhance the overall performance speed of iterative adiabatic quantum computation and quantum annealing algorithms.

BRIEF SUMMARY

A superconducting readout system may be summarized as including a first superconducting flux qubit including a qubit loop formed of a material that is superconducting below a critical temperature and at least one Josephson junction; a signal input line; a signal output line; and a variable transformer circuit comprising a DC-SQUID, a primary inductor, and a secondary inductor, wherein the DC-SQUID is communicatively coupleable to the qubit loop of the first superconducting flux qubit, the DC-SQUID and the primary inductor are electrically connected in parallel with one another with respect to the signal input line, the primary inductor and the secondary inductor are positioned sufficiently proximate one another to inductively couple signals therebetween, and the secondary inductor is electrically connected in series with the signal output line. Some embodiments may further include a first latching qubit including a first loop of superconducting material and a compound Josephson junction that interrupts the first loop of superconducting material, the compound Josephson junction comprising a closed loop of superconducting material interrupted by at least two Josephson junctions, wherein the first loop of superconducting material and the compound Josephson junction form a closed superconducting current path, wherein the first loop of superconducting material of the first latching qubit is communicatively coupleable to the qubit loop of the first superconducting flux qubit such that the DC-SQUID is communicatively coupleable to the qubit loop of the first superconducting flux qubit via the first latching qubit. Some embodiments may further include at least one additional latching qubit including a first loop of superconducting material and a compound Josephson junction that interrupts the first loop of superconducting material, the compound Josephson junction comprising a closed loop of superconducting material interrupted by at least two Josephson junctions, wherein the first loop of superconducting material and the compound Josephson junction form a closed superconducting current path, wherein the first loop of superconducting material of the at least one additional latching qubit is communicatively coupleable to the first latching qubit such that the DC-SQUID is communicatively coupleable to the qubit loop of the first superconducting flux qubit via the first latching qubit and the at least one additional latching qubit. The first loop of superconducting material of the first latching qubit may be positioned sufficiently proximate the first loop of superconducting material of the at least one additional latching qubit to inductively couple signals therebetween. The first latching qubit may be communicatively coupleable to the first superconducting flux qubit via galvanic coupling or inductive coupling.

In some embodiments, the superconducting readout system may include a second superconducting flux qubit including a qubit loop formed of a material that is superconducting below a critical temperature and at least one Josephson junction, wherein the DC-SQUID of the variable transformer circuit is communicatively coupleable to the qubit loop of the second superconducting flux qubit; a second latching qubit, wherein the second latching qubit is communicatively coupleable to the qubit loop of the second superconducting flux qubit; a third latching qubit, wherein the third latching qubit is communicatively coupleable to the DC-SQUID of the variable transformer circuit; and a plurality of additional latching qubits, wherein each of the first latching qubit, the second latching qubit, and the third latching qubit is communicatively coupleable to the plurality of additional latching qubits such that the DC-SQUID is communicatively coupleable to the first superconducting flux qubit via the first latching qubit, the third latching qubit, and at least a first subset of the plurality of additional latching qubits and the DC-SQUID is communicatively coupleable to the second superconducting flux qubit via the second latching qubit, the third latching qubit, and at least a second subset of the plurality of additional latching qubits. The plurality of additional latching qubits may be configured and arranged to operate as a superconducting shift register. Alternatively, the plurality of additional latching qubits may be configured and arranged to operate as a multiplexer circuit. The third latching qubit may be communicatively coupleable to the DC-SQUID of the variable transformer circuit via galvanic coupling or inductive coupling. Each of the first latching qubit, the second latching qubit, and the third latching qubit may be communicatively coupleable to a respective additional latching qubit in the plurality of additional latching qubits via galvanic coupling or inductive coupling. Some embodiments may include a signal input source for generating an excitation voltage and thereby producing a time-varying drive current in the signal input line. Some embodiments may include a device responsive to a characteristic of the signal output line to determine a transmitted power through the variable transformer circuit indicative of a state of the first superconducting flux qubit. The device may be responsive to at least one of: voltage amplitude, voltage phase, current amplitude, and current phase.

Any of the above embodiments may be combined to produce further embodiments.

A method of reading out a state of a superconducting flux qubit may be summarized as coupling a magnetic flux representative of the state of the superconducting flux qubit from the superconducting flux qubit to a DC-SQUID, wherein the DC-SQUID is electrically coupled in parallel with a primary inductor with respect to a signal input line; applying a time-varying drive current in the signal input line by a signal input source such that a fraction of the time-varying drive current is routed through the primary inductor; inductively coupling the primary inductor to a secondary inductor, wherein the secondary inductor is electrically coupled in series with a signal output line, such that a time-varying output signal is transmitted through the signal output line; and determining a characteristic of the time-varying output signal indicative of the state of the superconducting flux qubit. In some embodiments, the method may also include dividing the time-varying drive current between the DC-SQUID and the primary inductor such that a first fraction of the time-varying drive current is routed through the DC-SQUID and a second fraction of the time-varying drive current is routed through the primary inductor, and wherein the first fraction of the time-varying drive current that is routed through the DC-SQUID is dependent on the state of the superconducting flux qubit. The second fraction of the time-varying drive current that may be routed through the primary inductor represents a first portion of the time-varying drive current when the superconducting flux qubit is in a 0 state and a second portion of the time-varying drive current when the superconducting flux qubit is in a 1 state. Applying a time-varying drive current may include applying an AC drive current having a frequency in the microwave frequency range. Coupling a magnetic flux representative of the state of the superconducting flux qubit from the superconducting flux qubit to a DC-SQUID may include latching the state of the superconducting flux qubit using a latching qubit to define a latched state, and coupling the latched state from the latching qubit to the DC-SQUID. In some embodiments, coupling the latched state from the latching qubit to the DC-SQUID may include sequentially routing the latched state from the latching qubit via a routing system comprising a plurality of additional latching qubits to the DC-SQUID.

Any of the above embodiments may be combined to produce further embodiments.

A method of reading out a state of each superconducting flux qubit in a plurality of superconducting flux qubits may be summarized as latching the state of each superconducting flux qubit using a respective latching qubit to define a plurality of latched states; coupling the latched states to a routing system comprising a plurality of additional latching qubits; coupling the latched state corresponding to a first superconducting flux qubit from the routing system to a DC-SQUID, wherein the DC-SQUID is electrically coupled in parallel with a primary inductor with respect to a signal input line; using a signal input source to apply a time-varying drive current in the signal input line such that a fraction of the time-varying drive current is routed through the primary inductor; inductively coupling the primary inductor to a secondary inductor, wherein the secondary inductor is electrically coupled in series with a signal output line, such that a time-varying output signal is transmitted through the signal output line; determining a characteristic of the time-varying output signal to determine the state of the first superconducting flux qubit; operating the routing system to couple the latched state corresponding to a second superconducting flux qubit from the routing system to the DC-SQUID; coupling the latched state corresponding to the second superconducting flux qubit from the routing system to the DC-SQUID; using the signal input source to apply time-varying drive current in the signal input line such that a fraction of the time-varying drive current is routed through the primary inductor; inductively coupling the primary inductor to the secondary inductor such that a time-varying output signal is transmitted through the signal output line; and determining a characteristic of the time-varying output signal to determine the state of the second superconducting flux qubit. In some embodiments, the method may further include operating the routing system to couple the latched state corresponding to an additional superconducting flux qubit from the routing system to the DC-SQUID; coupling the latched state corresponding to the additional superconducting flux qubit from the routing system to the DC-SQUID; using the signal input source to apply a time-varying drive current in the signal input line such that a fraction of the time-varying drive current is routed through the primary inductor; inductively coupling the primary inductor to the secondary inductor such that a time-varying output signal is transmitted through the signal output line; and determining a characteristic of the time-varying output signal to determine the state of the additional superconducting flux qubit. The signal input source may be used to apply an AC drive current having a microwave frequency that is phase-synchronized with an operation of the routing system.

Any of the above embodiments may be combined to produce further embodiments.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with quantum processors, such as quantum devices, coupling devices, and control systems including microprocessors and drive circuitry have not been shown or described in detail to avoid unnecessarily obscuring descriptions of the embodiments of the present systems and methods. Throughout this specification and the appended claims, the words "element" and "elements" are used to encompass, but are not limited to, all such structures, systems and devices associated with quantum processors, as well as their related programmable parameters.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors. It should also be noted that the term "or" is generally employed in its sense including "and/or" unless the content clearly dictates otherwise.

The headings provided herein are for convenience only and do not interpret the scope or meaning of the embodiments.

Figure 2:
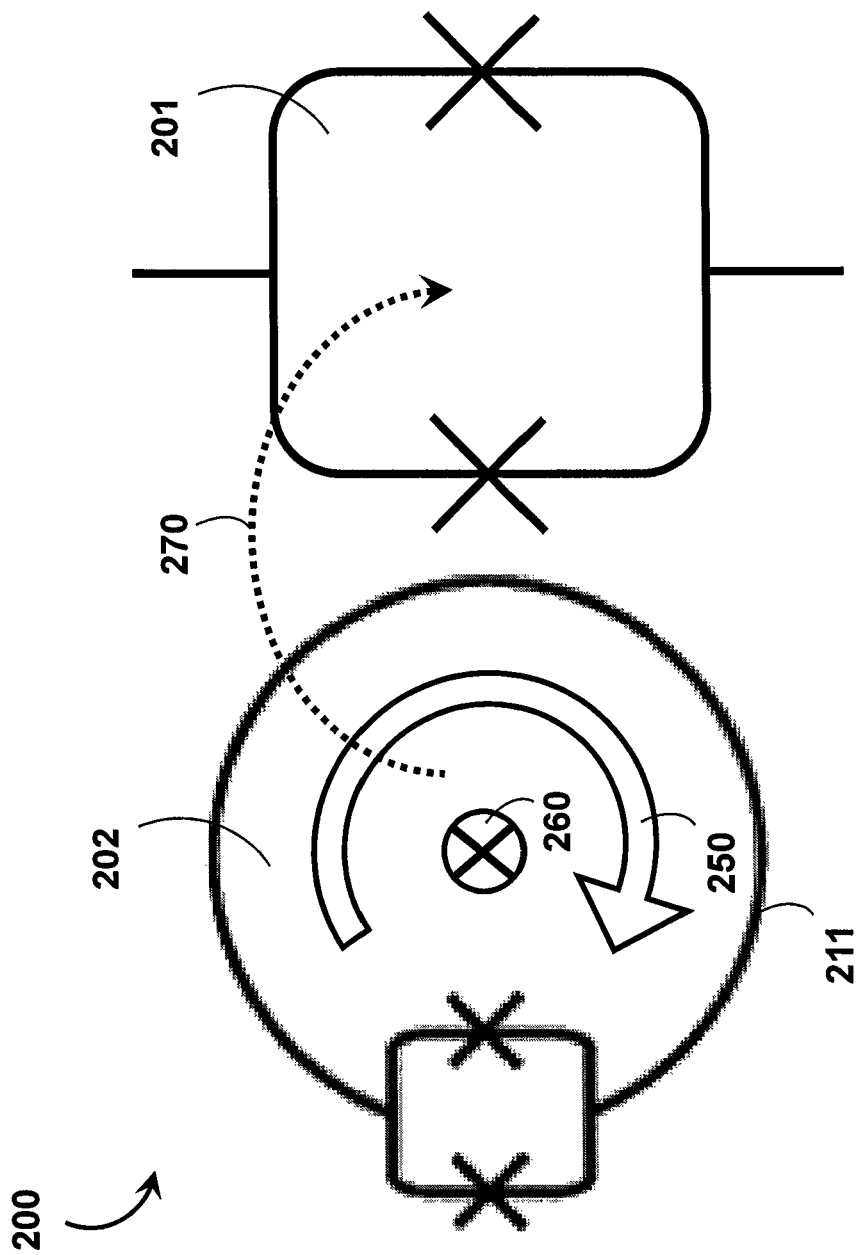
FIG. 2 is a schematic diagram of a readout system employing a DC-SQUID magnetometer to readout the classical state of a superconducting flux qubit.

The various embodiments described herein provide systems and methods for superconducting flux qubit readout. In particular, the readout systems and methods described herein are designed to measure the classical states of superconducting flux qubits while dissipating less energy than the techniques (such as readout system 200 from FIG. 2) already known in the art. This is achieved by coupling a qubit signal into a variable transformer circuit such that the qubit signal affects a transmitted power through the variable transformer circuit without causing any devices to undesirably dissipate significant energy.

Figure 3:
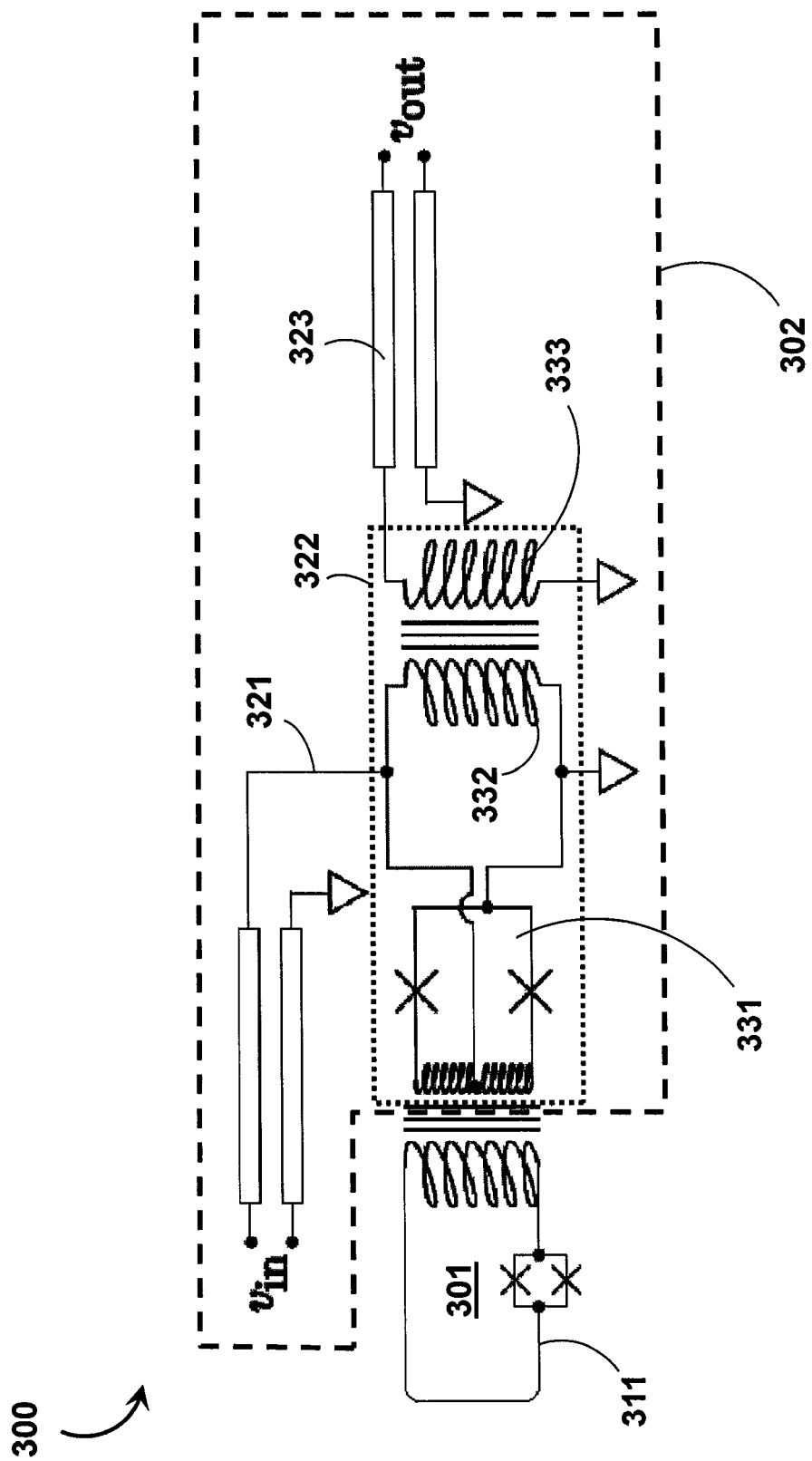
FIG. 3 is a schematic diagram of a superconducting readout system in accordance with at least one embodiment of the present systems and methods.

FIG. 3 shows a superconducting readout system 300 in accordance with at least one embodiment of the present systems and methods. Readout system 300 includes superconducting flux qubit 301 and a readout circuit 302. Superconducting flux qubit 301 comprises a qubit loop 311 formed of a material that is superconducting below a critical temperature and a compound Josephson junction 312. Readout circuit 302 includes a signal input line 321, a variable transformer circuit 322 communicatively coupleable (e.g., inductively coupled) to the qubit loop 311 of qubit 301, and a signal output line 323. Variable transformer circuit 322 comprises a DC-SQUID 331, a primary inductor 332 electrically coupled in parallel with DC-SQUID 331 with respect to signal input line 321, and a secondary inductor 333 positioned sufficiently proximate primary inductor 332 to inductively couple signals therebetween. Secondary inductor 333 is electrically coupled in series with signal output line 323. The operation of readout system 300 is now described.

Figure 1B:
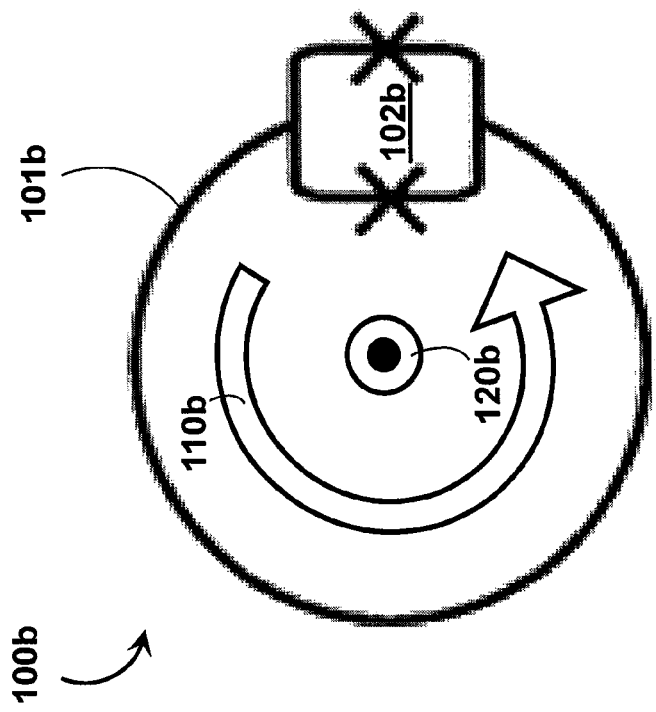
FIG. 1B is a schematic diagram of a superconducting flux qubit having a qubit loop and a compound Josephson junction, wherein the superconducting flux qubit is illustrated in a 1 state.
Figure 1A:
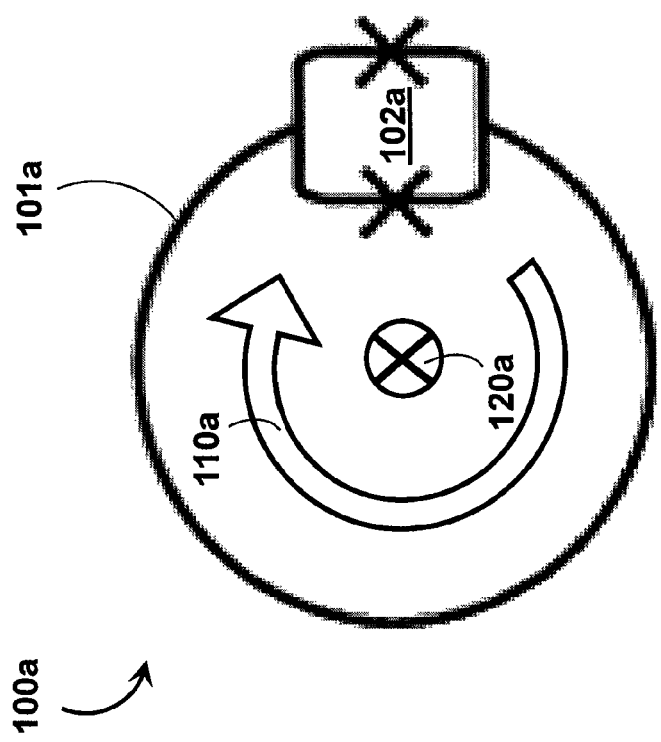
FIG. 1A is a schematic diagram of a superconducting flux qubit having a qubit loop and a compound Josephson junction, wherein the superconducting flux qubit is illustrated in a 0 state.

DC-SQUID 331 is communicatively coupleable (e.g., inductively coupled) to the qubit loop 311 of qubit 301. In alternative embodiments, DC-SQUID 331 may be galvanically coupled to the qubit loop 311 of qubit 301. Magnetic flux representative of the state of qubit 301 (as described in the context of FIGS. 1A, 1B, and 2) is thus coupled from qubit 301 to DC-SQUID 331. In some embodiments, DC-SQUID 331 may also be communicatively coupleable (e.g., inductively coupled) to a flux bias line that is omitted from FIG. 3 to improve clarity. Flux biasing of DC-SQUID 331 may be used, for example, to control the effective critical current of DC-SQUID 331 (i.e., how closely the DC-SQUID operates to the critical current(s) of its Josephson junction(s)). The total flux in DC-SQUID 331 controls the effective critical current of DC-SQUID 331; that is, the total flux in DC-SQUID 331 controls the maximum amount of current that can be routed through DC-SQUID 331 from signal input line 321 without causing DC-SQUID 331 to switch into its voltage state and dissipate energy. The total flux in DC-SQUID 331 is equal to the flux applied from the flux bias line plus the flux coupled into DC-SQUID 331 from qubit 301.

While FIG. 3 shows signal input line 321 galvanically coupled to variable transformer circuit 322, in alternative embodiments signal input line 321 may be inductively coupled to variable transformer circuit 322.

Readout circuit 302 is driven by an excitation voltage at (e.g., a time-varying signal such as an AC voltage) and the resulting drive current (e.g., time-varying drive current such as an AC drive current) is shunted to ground through two paths: through DC-SQUID 331 and through primary inductor 332. Thus, at least some embodiments include a signal input source at that generates an excitation voltage and thereby produces a time-varying drive current in signal input line 321. The drive current is divided between two parallel paths: a first fraction of the drive current is routed through DC-SQUID 331 and a second fraction (i.e., the remainder) of the drive current is routed through primary inductor 332. The first fraction of the drive current that is routed through DC-SQUID 331 depends on the total flux present in DC-SQUID 331. In other terms, the first fraction of the drive current that is routed through DC-SQUID 331 depends on the effective critical current of DC-SQUID 331. If DC-SQUID 331 were to exceed its critical current, it would switch into a voltage state and become resistive. Primary inductor 332 effectively shunts DC-SQUID 331 and prevents DC-SQUID 331 from becoming resistive. Since the total flux in DC-SQUID 331 depends on the state of qubit 301, the second fraction of the drive current that is routed through primary inductor 332 represents a first portion of the total drive current when qubit 301 is in its 0 state and a second portion of the total drive current when qubit 301 is in its 1 state. Primary inductor 332 is communicatively coupleable (e.g., inductively coupled) to secondary inductor 333 such that the excitation voltage from $v_{in}$ generates an output voltage (e.g., a time-varying output signal such as an AC output voltage) at $v_{out}$ through signal output line 323. The amplitude and/or phase of the output voltage at $v_{out}$ is then indicative of the state of qubit 301. Thus, some embodiments include a measuring device or sensor to measure, sense or otherwise determine a characteristic of signal output line 323 and thereby measure, sense or otherwise determine a transmitted power through variable transformer circuit 322 indicative of a state of qubit 301. The characteristic of signal output line 323 that is measured, sensed or otherwise determined may include a direction and/or magnitude and/or phase of a current and/or a voltage.

For example, with qubit 301 in its 0 state, DC-SQUID 331 operates with a first effective critical current and a first portion of the drive current is shunted through primary inductor 332 and inductively coupled to secondary inductor 333. This first portion of the drive current gives rise to a first output voltage at $v_{out}$ corresponding to the 0 state of qubit 301. Alternatively, with qubit 301 in its 1 state, DC-SQUID 331 operates with a second effective critical current and a second portion of the drive current is shunted through primary inductor 332 and inductively coupled to secondary inductor 333. This second portion of the drive current gives rise to a second output voltage at $v_{out}$ corresponding to the 1 state of qubit 301. Thus, readout system 300 provides a way of distinguishing between the 0 and 1 states of qubit 301 by measuring the transmitted power through variable transformer circuit 322 without causing any components to switch into a voltage state and dissipate significant energy. Readout system 300 is substantially non-dissipative and well suited for use in, for example, a superconducting quantum processor designed to implement adiabatic quantum computation and/or quantum annealing.

A person of skill in the art will appreciate that primary inductor 332 is a reactive circuit element and may therefore shunt DC-SQUID 331 without dissipating significant energy.

The speed at which readout system 300 operates may be controlled, at least in part, by the frequency of the drive current applied through signal input line 321. The readout time of a conventional DC-SQUID switching measurement (such as that described for readout system 200 from FIG. 2) is typically on the order of µs. Readout system 300, however, may be operated at significantly faster (e.g., ns) time scales by implementing, in some embodiments, a microwave signal for the drive current applied through signal input line 321. For the purposes of the present systems and methods, the term "microwave signal" is used to generally describe a signal having a frequency in the range of 100 MHz to 300 GHz. A person of skill in the art will nevertheless appreciate that the presence of noise in readout circuit 302 and/or in qubit 301 may limit the speed at which readout system 300 may practically be operated. In some embodiments, it may be preferable to operate using a microwave signal having a frequency in the approximate range of 1 GHz to 20 GHz.

In some embodiments, it may be advantageous to include a buffer element to mediate communicative coupling between qubit 301 and DC-SQUID 331. Such a buffer element may help, for example, to reduce any back-action on qubit 301 from readout circuit 302 which can otherwise undesirably affect (e.g., destroy) the state of qubit 301. In accordance with the present systems and methods, communicative coupling between the qubit loop 311 of qubit 301 and the DC-SQUID 331 of readout circuit 302 may be mediated by at least one latching element, for example a "latching qubit" element as described in U.S. Pat. Nos. 7,843,209, 8,018,244, U.S. Patent Publication 2009-0078931 and PCT Publication 2009-149086 (now U.S. Patent Publication 2011-0065586).

A superconducting flux qubit is typically operated as an element of computation (i.e., a "computation qubit"). However, as taught in the above-listed patent publications, the electrical circuit of a superconducting flux qubit may also be operated as a latching device. For the purposes of the present systems and methods, the term "superconducting flux qubit" is generally used to refer to a qubit structure that is used as an element of computation in a quantum processor. Conversely, the term "latching qubit" is used to refer to a similar qubit-like structure that is used as a latching device in a quantum processor. In operation, a "superconducting flux qubit" is evolved from an initial state to a final state in accordance with the computation algorithm, while a "latching qubit" is used as a logical circuit element to load an instantaneous source signal, retain the instantaneous signal despite perturbations or evolutions in the source signal, and continuously output the instantaneous signal until the latching operation is quenched. Thus, the term "latching qubit" is used herein to denote a device that is configured and/or coupled to implement this process, while the term "superconducting flux qubit" is used herein to denote a qubit that is evolved to perform quantum computation.

In some embodiments, a latching qubit may comprise a first loop of superconducting material and a compound Josephson junction ("CJJ") that interrupts the first loop of superconducting material, the CJJ comprising a closed loop of superconducting material interrupted by at least two Josephson junctions, wherein the first loop of superconducting material and the CJJ form a closed superconducting current path. The latching operation of a latching qubit is controlled by a clock signal that is coupled (e.g., inductively coupled) to the CJJ of the latching qubit. In some embodiments, whenever the clock signal pulses, the latching qubit loads an input signal that is coupled (e.g., galvanically or inductively coupled) to the first loop of superconducting material of the latching qubit, holds that instantaneous signal, and transmits the held instantaneous signal to an output (for example, another device that is galvanically or inductively coupled to the first loop of superconducting material of the latching qubit) for the duration of the clock pulse.

Those of skill in the art will appreciate that the term "latching qubit" is used herein to describe a quantum flux parametron-type device that may, as introduced in U.S. Pat. No. 7,843,209, be implemented as a fundamental circuit component or logic device. A latching qubit may be similar in structure to a superconducting flux qubit, though it is generally not operated as a quantum binary digit.

Figure 4:
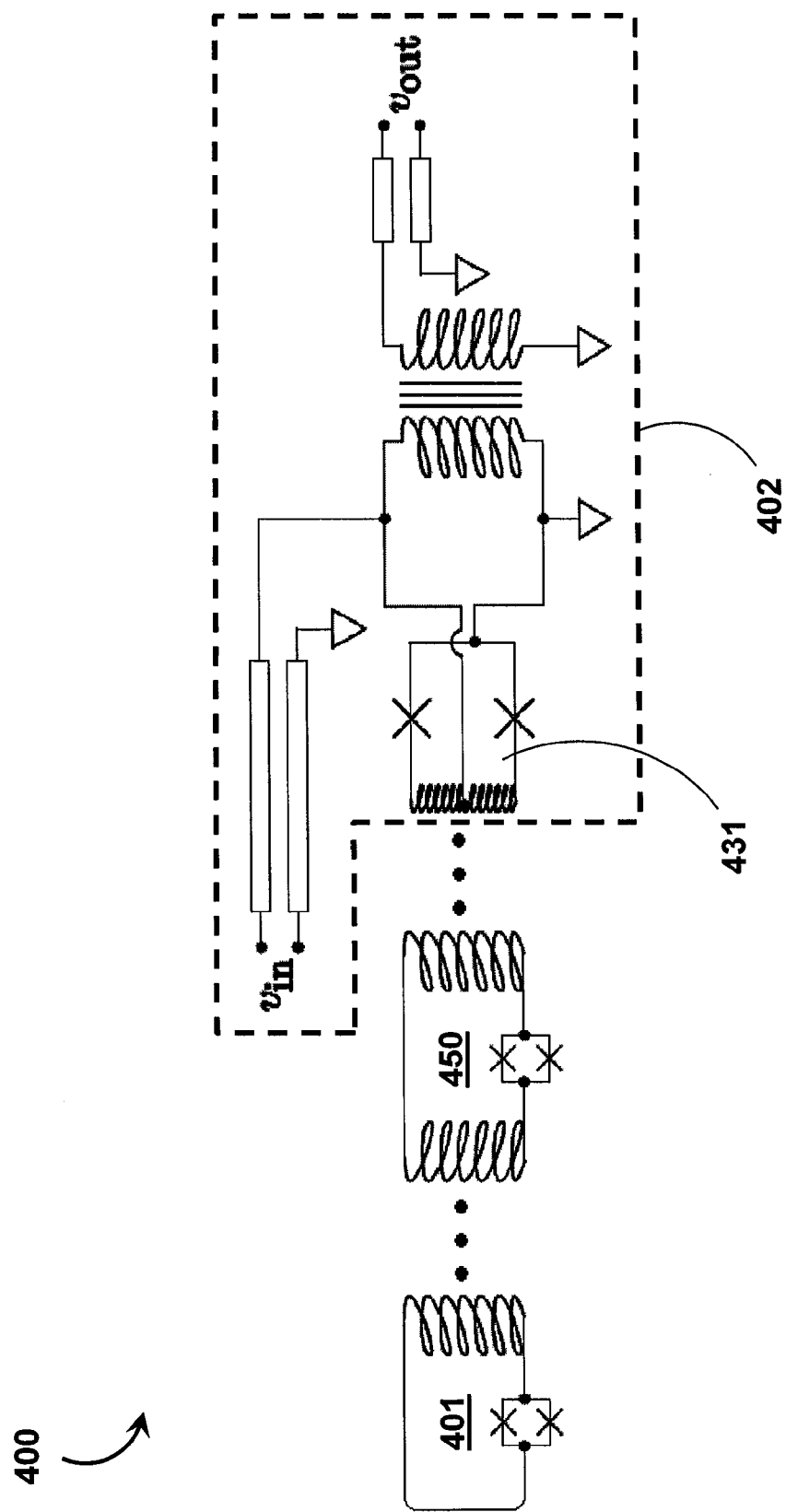
FIG. 4 is a schematic diagram of a superconducting readout system employing a latching qubit as a buffer element in accordance with at least one embodiment the present systems and methods.

FIG. 4 shows a superconducting readout system 400 employing a latching qubit 450 as a buffer element in accordance with at least one embodiment of the present systems and methods. Readout system 400 includes superconducting flux qubit 401, latching qubit 450, and readout circuit 402. Readout circuit 402 is substantially similar to readout circuit 302 from FIG. 3 and includes DC-SQUID 431. As in readout system 300 from FIG. 3, DC-SQUID 431 is communicatively coupleable to qubit 401, except in readout system 400, latching qubit 450 mediates communicative coupling between DC-SQUID 431 and qubit 401. In other words, DC-SQUID 431 is communicatively coupleable to qubit 401 via latching qubit 450. In some embodiments, DC-SQUID 431 may be communicatively coupleable to latching qubit 450 by inductive coupling, while in other embodiments DC-SQUID 431 may be communicatively coupleable to latching qubit 450 by galvanic coupling. Similarly, in some embodiments, qubit 401 may be communicatively coupleable to latching qubit 450 by inductive coupling, while in other embodiments qubit 401 may be communicatively coupleable to latching qubit 450 by galvanic coupling. Latching qubit 450 may be used to latch the state of qubit 401 and readout circuit 402 may be used to read the latched state from latching qubit 450 without probing qubit 401 directly. In this way, latching qubit 450 may help to isolate qubit 401 from any back-action introduced by readout circuit 402 during a readout operation. In some embodiments, latching qubit 450 may be specifically designed to tolerate strong coupling to DC-SQUID 431. The latching operation of latching qubit 450 is controlled by a clock signal line 460 that is coupled to the compound Josephson junction 451 of latching qubit 450. Further details of controlling the latching mechanism of latching qubit 450 are provided in U.S. Pat. Nos. 7,843,209, 8,018,244, U.S. Patent Publication 2009-0078931 and PCT Publication 2009-149086 (now U.S. Patent Publication 2011-0065586).

In accordance with the present systems and methods, any number of latching qubits 450 may be used to mediate communicative coupling between qubit 401 and readout circuit 402. For example, some embodiments may include a first latching qubit that is communicatively coupleable to the qubit loop of a first superconducting flux qubit 401 such that DC-SQUID 431 is communicatively coupleable to the qubit loop of the first superconducting flux qubit 401 via the first latching qubit. The first latching qubit may be communicatively coupleable to the first superconducting flux qubit 401 via galvanic coupling or inductive coupling. In some embodiments, at least one additional latching qubit may be communicatively coupleable to the first latching qubit such that DC-SQUID 431 is communicatively coupleable to the qubit loop of first superconducting flux qubit 401 via sequential coupling through the first latching qubit and the at least one additional latching qubit. The at least one additional latching qubit may be positioned sufficiently proximate the first latching qubit to inductively couple signals therebetween, or the at least one additional latching qubit may be galvanically coupled to the first latching qubit.

In accordance with the present system and methods, a single readout circuit (e.g., readout circuit 302 or 402) may be used to read out the states of multiple superconducting flux qubits by incorporating a system for routing flux signals from each superconducting flux qubit to the readout circuit.

In some embodiments, the system for routing flux signals from multiple superconducting flux qubits to a single readout circuit may include a plurality of latching qubits.

Figure 5:
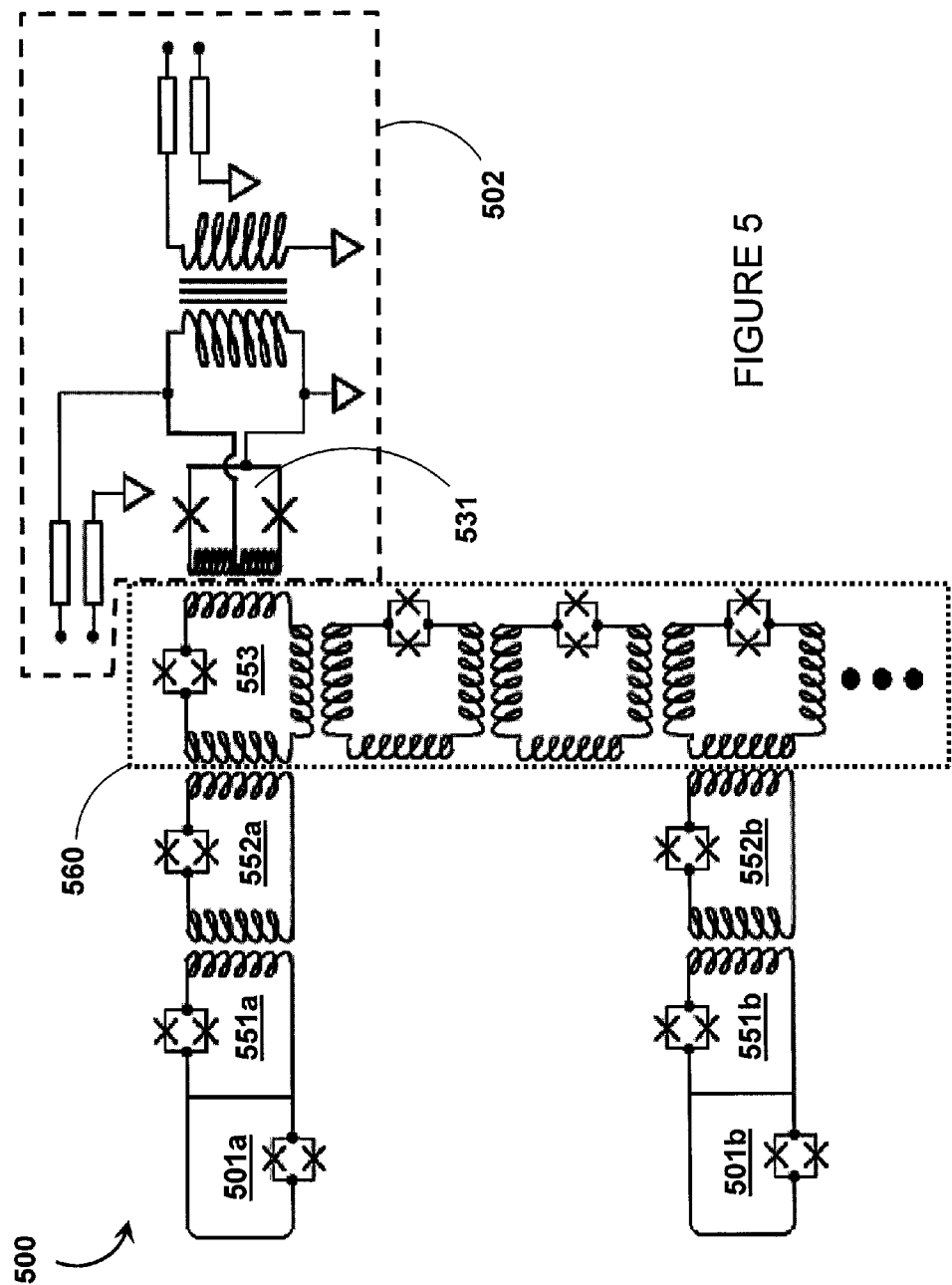
FIG. 5 is a schematic diagram of a superconducting readout system including a superconducting shift register operable to route flux signals from at least two superconducting flux qubits to a single readout circuit.

FIG. 5 is a schematic diagram of an embodiment of a superconducting readout system 500 including a superconducting shift register 560 operable to route flux signals from at least two superconducting flux qubits 501a, 501b to a single readout circuit 502. In some embodiments, readout system 500 constitutes at least a portion of a superconducting quantum processor which may, for example, be configured to perform adiabatic quantum computation and/or quantum annealing. Readout system 500 includes a first superconducting flux qubit 501a and a second superconducting flux qubit 501b. In the illustrated embodiment, first superconducting flux qubit 501a is communicatively coupleable to a first latching qubit 551a via galvanic coupling and second superconducting flux qubit 501b is communicatively coupleable to a second latching qubit 551b via galvanic coupling; though a person of skill in the art will appreciate that the communicative coupling between first superconducting flux qubit 501a and first latching qubit 551a, and/or the communicative coupling between second superconducting flux qubit 501b and second latching qubit 551b may be via an alternative form of coupling, such as inductive coupling.

Readout system 500 further includes a plurality of additional latching qubits configured and arranged to operate as a superconducting shift register 560 in accordance with the teachings of U.S. Pat. Nos. 7,843,209, 8,018,244, and U.S. Patent Publication 2009-0078931. Superconducting shift register 560 may employ a three-phase clocking system in order to control the direction of propagation through the constituent latching qubits. A person of skill in the art will appreciate that a plurality of (e.g., three) clock signal lines (not illustrated in FIG. 5 to enhance clarity) may be communicatively coupled to superconducting shift register 560 in order to realize this three-phase clocking system, as taught in U.S. Pat. Nos. 7,843,209, 8,018,244, and U.S. Patent Publication 2009-0078931.

Superconducting shift register 560 includes a third latching qubit 553 that is communicatively coupleable to DC-SQUID 531 in readout circuit 502. As illustrated, third latching qubit 553 is communicatively coupleable to DC-SQUID 531 via inductive coupling, though a person of skill in the art will appreciate that alternative forms of coupling, such as galvanic coupling, may similarly be used. DC-SQUID 531 is communicatively coupleable to the qubit loop of first superconducting flux qubit 501a via first latching qubit 551a and at least a first subset of the plurality of additional latching qubits in superconducting shift register 560 (including third latching qubit 553), while DC-SQUID 531 is communicatively coupleable to the qubit loop of second superconducting flux qubit 501b via at least second latching qubit 551b and a second subset of the plurality of additional latching qubits in superconducting shift register 560 (including third latching qubit 553).

In operation, first latching qubit 551a and second latching qubit 551b may be used to latch the qubit states of first superconducting flux qubit 501a and second superconducting flux qubit 501b, respectively. These latched qubits states may then be coupled into superconducting shift register 560, either directly or (as illustrated in FIG. 5) through respective additional latching qubits 552a and 552b. Superconducting shift register 560 may then be used to sequentially communicatively couple the latched qubit states of superconducting flux qubits 501a and 501b to DC-SQUID 531 in readout circuit 502. For example, the latched state of first superconducting flux qubit 501a may be communicatively coupled from third latching qubit 553 in superconducting shift register 560 to DC-SQUID 531 in readout circuit 502. Readout circuit 502 may then be employed to output a signal representative of the state of first superconducting flux qubit 501a in a manner similar to that described for readout circuits 302 and 402 of FIGS. 3 and 4, respectively. Once the latched state of first superconducting flux qubit 501a has been read out, superconducting shift register 560 may be operated to route the latched state of second superconducting flux qubit 501b to third latching qubit 553 and readout circuit 502 may then be employed to read out the latched state of second superconducting flux qubit 501b. In this way, readout circuit 502 may be used to read out the states of any number of superconducting flux qubits routed through superconducting shift register 560. In some embodiments, the phase of the drive current controlling readout circuit 502 may be synchronized with the phase of the superconducting shift register 560 clock signals to help keep track of which qubit state is being read out at any given time. In some embodiments, it may be advantageous to perform multiple readout operations of a first qubit state before operating superconducting shift register 560 to shift to a second qubit state. In such embodiments, readout circuit 502 may be operated at a frequency that is faster than the frequency at which superconducting shift register 560 is operated, though the phases of the two signals may still be synchronized (e.g., 1 shift register period per 100 readout circuit periods, etc.).

A person of skill in the art will appreciate that the embodiment of readout system 500 in FIG. 5 is illustrated for exemplary purposes and, in practice, the exact layout, configuration, and number of latching qubits employed may differ in alternative embodiments. For example, additional latching qubits may be employed to mediate some or all of the communicative couplings illustrated in FIG. 5 in order to provide a further degree of isolation between coupled devices and/or to better control the direction of propagation of latched signals. U.S. Pat. Nos. 7,843,209, 8,018,244, and U.S. Patent Publication 2009-0078931 describe various alternative schematics for superconducting shift registers employing latching qubits and a person of skill in the art will appreciate that any of those variations, and similarly any further variations, may similarly be employed in the present systems and methods.

PCT Publication 2009-149086 (now U.S. Patent Publication 2011-0065586) provides descriptions of demultiplexer circuits in which latching qubits are used as the fundamental switching elements. A demultiplexer circuit employing latching qubits may alternatively be operated in reverse as a multiplexer circuit, and in accordance with the present systems and methods, a multiplexer circuit employing latching qubits may be used to mediate the communicative coupling between multiple superconducting flux qubits and a single readout circuit. That is, in some embodiments, the plurality of additional latching qubits that are configured and arranged to operate as superconducting shift register 560 in readout system 500 may alternatively be configured and arranged to operate as a multiplexer circuit.

The various embodiments described herein provide a method for reading out the state of one or many superconducting flux qubits in, for example, a superconducting quantum processor.

Figure 6:
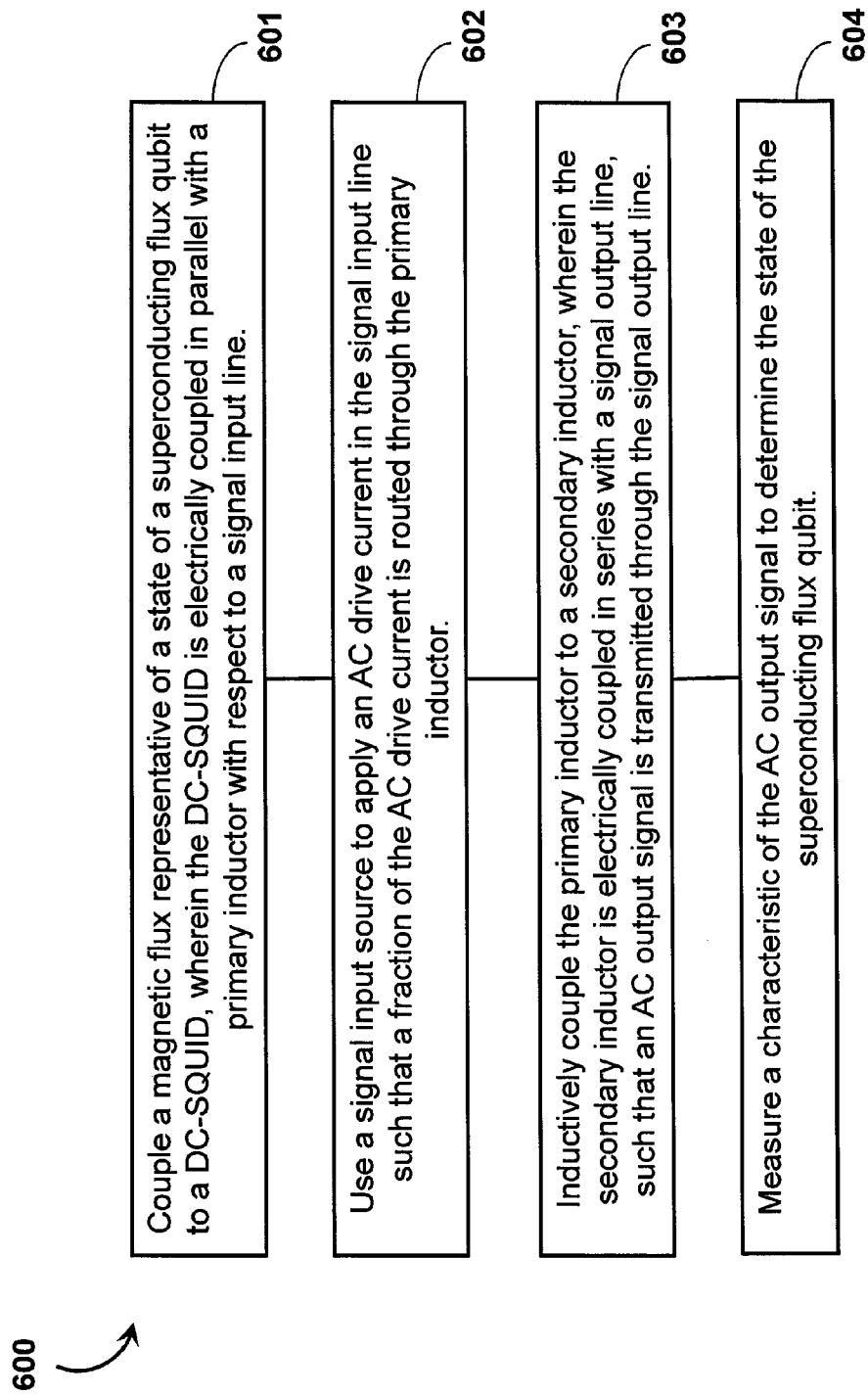
FIG. 6 is a flow-diagram of a method for reading out a state of a superconducting flux qubit in accordance with at least one embodiment the present systems and methods.

FIG. 6 shows a method 600 for reading out a state of a superconducting flux qubit. Method 600 includes four (4) acts 601-604, though a person of skill in the art will appreciate that in alternative embodiments certain acts may be omitted and/or additional acts or steps may be included in various applications of method 600. At 601, a magnetic flux that is representative of the state of the superconducting flux qubit is coupled to a DC-SQUID, wherein the DC-SQUID is electrically coupled in parallel with a primary inductor with respect to an input signal line. The parallel combination of the DC-SQUID and the primary inductor may together form part of a variable transformer circuit such as variable transformer circuit 322 described in FIG. 3. As previously described, the magnetic flux representative of the state of the superconducting flux qubit may be coupled directly into the DC-SQUID, or the magnetic flux representative of the state of the superconducting flux qubit may be latched by a latching qubit and then this latched state may be coupled to the DC-SQUID, either directly or by routing through a plurality of additional latching qubits.

At 602, a signal input source applies a drive current (e.g., a time-varying drive current such as an AC drive current) in the signal input line such that a fraction of the drive current is routed through the primary inductor. In some embodiments, the applied drive current may be at a microwave frequency, such as 100 MHz to 300 GHz, though in other embodiments a frequency outside of this range may be employed. In some embodiments, the frequency of the drive current may be in the range of 1 GHz to 20 GHz. The drive current is divided between the parallel combination of the DC-SQUID and the primary inductor such that a first fraction of the drive current is routed through the DC-SQUID and a second fraction of the drive current is routed through the primary inductor. The first fraction of the drive current that is routed through the DC-SQUID is dependent on the state of the superconducting flux qubit; thus, the second fraction of the drive current that is routed through the primary inductor is also dependent on the state of the superconducting flux qubit. The second fraction of the drive current that is routed through the primary inductor represents a first portion of the total drive current when the superconducting flux qubit is in a 0 state and a second portion of the total drive current when the superconducting flux qubit is in a 1 state.

At 603, the primary inductor is inductively coupled to a secondary inductor, wherein the secondary inductor is electrically coupled in series with a signal output line, such that an output signal (e.g., a time-varying output signal such as an AC output signal) is transmitted through the signal output line. The output signal is proportional to the second fraction of the drive current that is routed through the primary inductor. Thus, the output signal exhibits a first characteristic or magnitude when the superconducting flux qubit is in a 0 state and a second characteristic or magnitude when the superconducting flux qubit is in a 1 state. At 604, a characteristic of the output signal is measured, sensed or otherwise determined to determine the state of the superconducting flux qubit. In some embodiments, the amplitude and/or phase of the voltage of the output signal may be measured, sensed or otherwise determined, while in other embodiments, the amplitude and/or phase of the current of the output signal may be measured.

In some embodiments, at least acts 602-604 may be repeated for multiple iterations in order to confirm the accuracy of the measured qubit state. In some embodiments, acts 601-604 may all be repeated for multiple iterations.

The acts of method 600 may be applied, with minor adaptations and/or additions, to read out the states of multiple superconducting flux qubits using a single readout circuit. Such is made possible by incorporating the operation of a routing system, such as a superconducting shift register or a superconducting multiplexer circuit, into the readout method.

Figure 7:
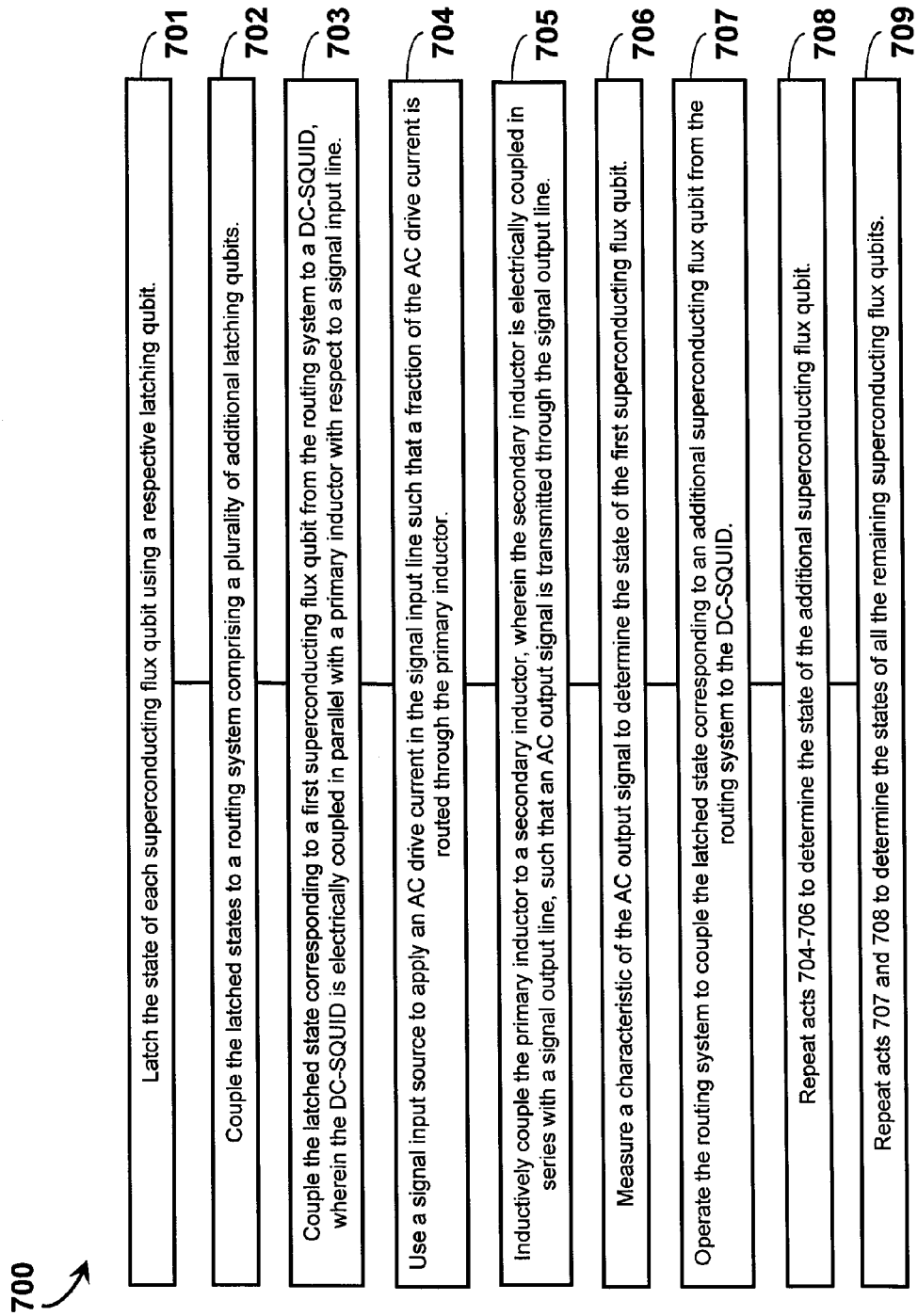
FIG. 7 is a flow-diagram of a method for using a single readout circuit to measure the states of multiple superconducting flux qubits in accordance with at least one embodiment the present systems and methods.

FIG. 7 shows a method 700 for using a single readout circuit to measure, sense or otherwise determine the states of multiple superconducting flux qubits. Method 700 includes nine (9) acts 701-709, though a person of skill in the art will appreciate that in alternative embodiments certain acts may be omitted and/or additional acts or steps may be included in various applications of method 700. At 701, the state of each superconducting flux qubit in a plurality of superconducting flux qubits (e.g., in a superconducting quantum processor) is latched using a respective latching qubit. In some embodiments, each superconducting flux qubit may be communicatively coupled to a respective latching qubit via galvanic coupling or inductive coupling. At 702, the latched states are all coupled to a routing system comprising a plurality of additional latching qubits. In some embodiments, the plurality of additional latching qubits may be configured and arranged to operate as a superconducting shift register. In other embodiments, the plurality of additional latching qubits may be configured and arranged to operate as a superconducting multiplexer circuit, or any other configuration that provides the desired routing functionality.

Acts 703-706 are similar in at least some respects to acts 601-604 from method 600 illustrated in FIG. 6. At 703, the latched state corresponding to a first superconducting flux qubit is coupled from the routing system to a DC-SQUID, wherein the DC-SQUID is electrically coupled in parallel with a primary inductor with respect to a signal input line. The parallel combination of the DC-SQUID and the primary inductor may together form part of a variable transformer circuit such as variable transformer circuit 322 described in FIG. 3. At 704, a signal input source is used to apply a drive current (e.g., a time-varying drive current such as an AC drive current) in the signal input line such that a fraction of the drive current is routed through the primary inductor. In some embodiments, the applied drive current may have a frequency in the microwave range, such as 100 MHz to 300 GHz, though in other embodiments a frequency outside of this range may be employed. The drive current is divided between the parallel combination of the DC-SQUID and the primary inductor such that a first fraction of the drive current is routed through the DC-SQUID and a second fraction of the drive current is routed through the primary inductor. The first fraction of the drive current that is routed through the DC-SQUID is dependent on the latched state of the first superconducting flux qubit; thus, the second fraction of the drive current that is routed through the primary inductor is also dependent on the latched state of the first superconducting flux qubit. The second fraction of the drive current that is routed through the primary inductor represents a first portion of the total drive current when the latched state of the first superconducting flux qubit is a 0 state and a second portion of the total drive current when the latched state of the first superconducting flux qubit is a 1 state.

At 705, the primary inductor is inductively coupled to a secondary inductor, wherein the secondary inductor is electrically coupled in series with a signal output line, such that an output signal (e.g., a time-varying output signal such as an AC output signal) is transmitted through the signal output line. The output signal is proportional to the second fraction of the drive current that is routed through the primary inductor. Thus, the output signal exhibits a first characteristic or magnitude when the latched state of the first superconducting flux qubit is a 0 state and a second characteristic or magnitude when the latched state of the first superconducting flux qubit is a 1 state. At 706, a characteristic of the output signal is measured, sensed or otherwise determined to determine the state of the first superconducting flux qubit. In some embodiments, the amplitude and/or phase of the voltage of the output signal may be measured, sensed or otherwise determined, while in other embodiments, the amplitude and/or phase of the current of the output signal may be measured, sensed or otherwise determined.

At 707, the routing system is operated to couple the latched state corresponding to an additional superconducting flux qubit from the routing system to the DC-SQUID. In some embodiments, operation of the routing system involves sequentially coupling a latched state between respective pairs of latching qubits in a plurality of additional latching qubits (e.g., embodying a superconducting shift register or a multiplexer circuit) in order to route the latched state from a first latching qubit in the plurality of additional latching qubits to a second latching qubit in the plurality of additional latching qubits, where the second latching qubit in the plurality of additional latching qubits is positioned sufficiently proximate the DC-SQUID to inductively couple the latched state thereto, or the second latching qubit in the plurality of latching qubits is galvanically coupled to the DC-SQUID.

At 708, acts 704-706 are repeated to determine the state of the additional superconducting flux qubit. Specifically, acts 704-706 are repeated using the latched state corresponding to the additional superconducting flux qubit in place of the latched state corresponding to the first superconducting flux qubit, where the latched state corresponding to the additional superconducting flux qubit was routed to the DC-SQUID in act 707.

At 709, acts 707 and 708 are repeated to sequentially determine the states of all the remaining superconducting flux qubits in the plurality of superconducting flux qubits.

Throughout this specification and the appended claims, reference is often made to a "drive current." In some embodiments, a time-varying drive current (e.g., an AC drive current) is used in order to facilitate the reading out of multiple superconducting flux qubits using a single readout circuit. A person of skill in the art will appreciate, in light of the present disclosure, that a routing system (such as superconducting shift register 560 from FIG. 5) may be driven and/or clocked by a modulated waveform(s) or an AC clocking signal(s) such that latched states may be made to propagate through the routing system at a controlled rate. Thus, the time-varying drive current (e.g., AC drive current) used in various embodiments of readout circuits described herein may be selected to phase-synchronize with the modulated waveform(s) or AC clocking signal(s) used in the routing system such that the sequential reading out of the latched states of multiple superconducting flux qubits is an automated and relatively fast process; or vice versa, the modulated waveform(s) or AC clocking signal(s) used in the routing system may be selected to phase-synchronize with the drive current used to operate the readout circuit. The speed of this automated and synchronized route/read process is further enhanced by the fact that the DC-SQUID does not switch into its voltage state, as this avoids introducing unwanted thermalization delays.

In some embodiments of the present systems and methods, it may be advantageous to employ multiple readout circuits (e.g., readout circuits 302, 402, and/or 502) within a single superconducting quantum processor architecture. Use of a routing system, such as shift register 560, may enable a single readout circuit to provide fast readout of multiple qubits within a quantum processor, but in some embodiments the readout process may be made faster, more efficient, simpler, or may otherwise be improved by implementing multiple readout circuits. For example, depending on the layout of qubits within the quantum processor, a complicated routing system may be required to route signals from all qubits to the same readout circuit; whereas the routing system may be simplified if a second readout circuit is provided such that signals from some qubits may be routed to a first readout circuit and signals from other qubits may be routed to the second readout circuit. Providing multiple readout circuits also provides redundancy in the event that one of the readout circuits is defective.

In some embodiments of the present systems and methods, a latching qubit may be operated in a regime where it acts as a tunable mutual inductance between two devices (e.g., between a qubit and a DC-SQUID). In such embodiments, the operation of the latching qubit may closely resemble the operation of the coupling devices described in U.S. Pat. No. 7,898,282, which provide a coupling strength that can be modulated between ferromagnetic and anti-ferromagnetic coupling, and/or the multipliers described in U.S. Patent Publication 2011-0060780.

Throughout this specification and the appended claims, the term "DC-SQUID" (e.g., DC-SQUID 331, DC-SQUID 431, DC-SQUID 531, etc.) is used to describe a loop of superconducting material having an input terminal, an output terminal, and two Josephson junctions connected in parallel with respect to the input and output terminals. However, in the various embodiments described herein, the input terminal and the output terminal of the DC-SQUID are electrically connected in series with one another through a primary inductor (e.g., primary inductor 332, etc.). A person of skill in the art will appreciate that this circuit may also be viewed as an RF-SQUID having a compound Josephson junction.

The various embodiments described herein provide systems and methods for reducing or eliminating the thermalization delays that may otherwise adversely affect the overall performance speed of iterative adiabatic quantum computation and quantum annealing algorithms. The present systems and methods provide such benefits without the need for the large resonator circuits that are typically employed in other non-dissipative readout schemes suitable seen in the art (e.g., for use in gate model and/or circuit model implementations of quantum computing). The various embodiments described herein provide non-dissipative readout systems that are significantly smaller in size than other non-dissipative readout schemes known in the art, thus considerably reducing the amount of space in the quantum processor architecture that needs to be allocated to the readout system.

Throughout this specification, reference is often made to implementations of the various embodiments of readout systems described herein in conjunction with superconducting quantum processors designed to perform adiabatic quantum computation and/or quantum annealing. While the present systems and methods are particularly well-suited for use in such applications (at least because superconducting quantum processors designed to perform adiabatic quantum computation and/or quantum annealing typically require that only the classical states of the qubits be read out at the end of a quantum evolution), a person of skill in the art will appreciate that the systems and methods for superconducting flux qubit state readout may advantageously be applied in superconducting quantum processors that are designed to perform other forms of quantum computation, such as gate model quantum computation and/or circuit model quantum computation.

Certain aspects of the present systems and methods may be realized at room temperature, and certain aspects may be realized at a superconducting temperature. Thus, throughout this specification and the appended claims, the terms "superconducting" and "superconductor" are used to indicate a material that is capable of behaving as a superconductor at an appropriate temperature. A superconducting material may not necessarily be acting as a superconductor at all times in all embodiments of the present systems and methods. In some embodiments, at least some of the superconducting circuit elements described herein may be electrically connected together through superconducting conductive traces. In other embodiments, at least some of the superconducting circuit elements described herein may be electrically connected together through non-superconducting conductive traces.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems and methods of quantum computation, not necessarily the exemplary systems and methods for quantum computation generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A superconducting readout system comprising:
a first superconducting flux qubit including a qubit loop formed of a material that is superconducting below a critical temperature and at least one Josephson junction;
a signal input line;
a signal output line; and
a variable transformer circuit comprising a DC-SQUID, a primary inductor, and a secondary inductor, wherein the DC-SQUID is communicatively coupleable to the qubit loop of the first superconducting flux qubit, the DC-SQUID and the primary inductor are electrically connected in parallel with one another with respect to the signal input line, the primary inductor and the secondary inductor are positioned sufficiently proximate one another to inductively couple signals therebetween, and the secondary inductor is electrically connected in series with the signal output line.

2. The superconducting readout system of claim 1, further comprising:
a first latching qubit including a first loop of superconducting material and a compound Josephson junction that interrupts the first loop of superconducting material, the compound Josephson junction comprising a closed loop of superconducting material interrupted by at least two Josephson junctions, wherein the first loop of superconducting material and the compound Josephson junction form a closed superconducting current path,
wherein the first loop of superconducting material of the first latching qubit is communicatively coupleable to the qubit loop of the first superconducting flux qubit such that the DC-SQUID is communicatively coupleable to the qubit loop of the first superconducting flux qubit via the first latching qubit.

3. The superconducting readout system of claim 2, further comprising:
at least one additional latching qubit including a first loop of superconducting material and a compound Josephson junction that interrupts the first loop of superconducting material, the compound Josephson junction comprising a closed loop of superconducting material interrupted by at least two Josephson junctions, wherein the first loop of superconducting material and the compound Josephson junction form a closed superconducting current path,
wherein the first loop of superconducting material of the at least one additional latching qubit is communicatively coupleable to the first latching qubit such that the DC-SQUID is communicatively coupleable to the qubit loop of the first superconducting flux qubit via the first latching qubit and the at least one additional latching qubit.

4. The superconducting readout system of claim 3 wherein the first loop of superconducting material of the first latching qubit is positioned sufficiently proximate the first loop of superconducting material of the at least one additional latching qubit to inductively couple signals therebetween.

5. The superconducting readout system of claim 2 wherein the first latching qubit is communicatively coupleable to the first superconducting flux qubit via galvanic coupling or inductive coupling.

6. The superconducting readout system of claim 2, further comprising:

a second superconducting flux qubit including a qubit loop formed of a material that is superconducting below a critical temperature and at least one Josephson junction, wherein the DC-SQUID of the variable transformer circuit is communicatively coupleable to the qubit loop of the second superconducting flux qubit;

a second latching qubit, wherein the second latching qubit is communicatively coupleable to the qubit loop of the second superconducting flux qubit;

a third latching qubit, wherein the third latching qubit is communicatively coupleable to the DC-SQUID of the variable transformer circuit; and a plurality of additional latching qubits, wherein each of the first latching qubit, the second latching qubit, and the third latching qubit is communicatively coupleable to the plurality of additional latching qubits such that the DC-SQUID is communicatively coupleable to the first superconducting flux qubit via the first latching qubit, the third latching qubit, and at least a first subset of the plurality of additional latching qubits and the DC-SQUID is communicatively coupleable to the second superconducting flux qubit via the second latching qubit, the third latching qubit, and at least a second subset of the plurality of additional latching qubits.

7. The superconducting readout system of claim 6 wherein the plurality of additional latching qubits is configured and arranged to operate as a superconducting shift register.

8. The superconducting readout system of claim 6 wherein the plurality of additional latching qubits is configured and arranged to operate as a multiplexer circuit.

9. The superconducting readout system of claim 6 wherein the third latching qubit is communicatively coupleable to the DC-SQUID of the variable transformer circuit via galvanic coupling or inductive coupling.

10. The superconducting readout system of claim 6 wherein each of the first latching qubit, the second latching qubit, and the third latching qubit is communicatively coupleable to a respective additional latching qubit in the plurality of additional latching qubits via galvanic coupling or inductive coupling.

11. The superconducting readout system of claim 1, further comprising:
a signal input source for generating an excitation voltage and thereby producing a time-varying drive current in the signal input line.

12. The superconducting readout system of claim 11, further comprising:
a device responsive to a characteristic of the signal output line to determine a transmitted power through the variable transformer circuit indicative of a state of the first superconducting flux qubit.

13. The superconducting readout system of claim 12 wherein the device is responsive to at least one of: voltage amplitude, voltage phase, current amplitude, and current phase.

14. A method of reading out a state of a superconducting flux qubit, the method comprising:
coupling a magnetic flux representative of the state of the superconducting flux qubit from the superconducting flux qubit to a DC-SQUID, wherein the DC-SQUID is electrically coupled in parallel with a primary inductor with respect to a signal input line;
applying a time-varying drive current in the signal input line by a signal input source such that a fraction of the time-varying drive current is routed through the primary inductor;
inductively coupling the primary inductor to a secondary inductor, wherein the secondary inductor is electrically coupled in series with a signal output line, such that a time-varying output signal is transmitted through the signal output line; and
determining a characteristic of the time-varying output signal indicative of the state of the superconducting flux qubit.

15. The method of claim 14 further comprising: dividing the time-varying drive current between the DC-SQUID and the primary inductor such that a first fraction of the time-varying drive current is routed through the DC-SQUID and a second fraction of the time-varying drive current is routed through the primary inductor, and wherein the first fraction of the time-varying drive current that is routed through the DC-SQUID is dependent on the state of the superconducting flux qubit.

16. The method of claim 15 wherein the second fraction of the time-varying drive current that is routed through the primary inductor represents a first portion of the time-varying drive current when the superconducting flux qubit is in a 0 state and a second portion of the time-varying drive current when the superconducting flux qubit is in a 1 state.

17. The method of claim 14 wherein applying a time-varying drive current includes applying an AC drive current having a frequency in the microwave frequency range.

18. The method of claim 14 wherein coupling a magnetic flux representative of the state of the superconducting flux qubit from the superconducting flux qubit to a DC-SQUID comprises latching the state of the superconducting flux qubit using a latching qubit to define a latched state, and coupling the latched state from the latching qubit to the DC-SQUID.

19. The method of claim 18 wherein coupling the latched state from the latching qubit to the DC-SQUID comprises sequentially routing the latched state from the latching qubit via a routing system comprising a plurality of additional latching qubits to the DC-SQUID.

20. A method of reading out a state of each superconducting flux qubit in a plurality of superconducting flux qubits, the method comprising:
latching the state of each superconducting flux qubit using a respective latching qubit to define a plurality of latched states;
coupling the latched states to a routing system comprising a plurality of additional latching qubits;
coupling the latched state corresponding to a first superconducting flux qubit from the routing system to a DC-SQUID, wherein the DC-SQUID is electrically coupled in parallel with a primary inductor with respect to a signal input line;
using a signal input source to apply a time-varying drive current in the signal input line such that a fraction of the time-varying drive current is routed through the primary inductor;
inductively coupling the primary inductor to a secondary inductor, wherein the secondary inductor is electrically coupled in series with a signal output line, such that a time-varying output signal is transmitted through the signal output line;
determining a characteristic of the time-varying output signal to determine the state of the first superconducting flux qubit;
operating the routing system to couple the latched state corresponding to a second superconducting flux qubit from the routing system to the DC-SQUID;

coupling the latched state corresponding to the second superconducting flux qubit from the routing system to the DC-SQUID;

using the signal input source to apply time-varying drive current in the signal input line such that a fraction of the time-varying drive current is routed through the primary inductor;

inductively coupling the primary inductor to the secondary inductor such that a time-varying output signal is transmitted through the signal output line; and determining a characteristic of the time-varying output signal to determine the state of the second superconducting flux qubit.

21. The method of claim 20, further comprising:

operating the routing system to couple the latched state corresponding to an additional superconducting flux qubit from the routing system to the DC-SQUID;

coupling the latched state corresponding to the additional superconducting flux qubit from the routing system to the DC-SQUID;

using the signal input source to apply a time-varying drive current in the signal input line such that a fraction of the time-varying drive current is routed through the primary inductor;

inductively coupling the primary inductor to the secondary inductor such that a time-varying output signal is transmitted through the signal output line; and determining a characteristic of the time-varying output signal to determine the state of the additional superconducting flux qubit.

22. The method of claim 20 wherein the signal input source is used to apply an AC drive current having a microwave frequency that is phase-synchronized with an operation of the routing system.

* * * * *

UNITED STATES PATENT AND TRADEMARK OFFICE
CERTIFICATE OF CORRECTION

| | | |
|---|---|---|
| PATENT NO. | : 8,854,074 B2 | Page 1 of 1 |
| APPLICATION NO. | : 13/808006 | |
| DATED | : October 7, 2014 | |
| INVENTOR(S) | : Andrew J. Berkley | |

It is certified that error appears in the above-identified patent and that said Letters Patent is hereby corrected as shown below:

Title page

Item (56):
"WO 2009/149083 A2 12/2009" should read, --WO 2009/149086 A2 12/2009--.

Signed and Sealed this
Eighth Day of December, 2015

Michelle K. Lee
*Director of the United States Patent and Trademark Office*